United States Patent
Miyaguchi et al.

(10) Patent No.: US 7,167,064 B2
(45) Date of Patent: Jan. 23, 2007

(54) PHASE SHIFT CIRCUIT AND PHASE SHIFTER

(75) Inventors: Kenichi Miyaguchi, Tokyo (JP); Morishige Hieda, Tokyo (JP); Michiaki Kasahara, Tokyo (JP); Tadashi Takagi, Tokyo (JP); Mikio Hatamoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 65 days.

(21) Appl. No.: 10/471,174

(22) PCT Filed: Jan. 7, 2003

(86) PCT No.: PCT/JP03/00042

§ 371 (c)(1),
(2), (4) Date: Sep. 9, 2003

(87) PCT Pub. No.: WO03/061120

PCT Pub. Date: Jul. 24, 2003

(65) Prior Publication Data

US 2004/0085112 A1 May 6, 2004

(30) Foreign Application Priority Data

Jan. 10, 2002 (JP) .............................. 2002-003657

(51) Int. Cl.
*H01P 1/18* (2006.01)
(52) U.S. Cl. ...................................... 333/164; 333/138
(58) Field of Classification Search ................ 333/164, 333/161, 156, 160, 262, 138, 139
See application file for complete search history.

(56) References Cited

U.S. PATENT DOCUMENTS

| 4,288,763 A | * | 9/1981 | Hopfer | ........................ 333/164 |
| 5,422,608 A | * | 6/1995 | Levesque | .................... 333/17.3 |
| 6,674,341 B1 | * | 1/2004 | Hieda et al. | ................ 333/164 |

FOREIGN PATENT DOCUMENTS

| JP | 2000-277703 | * | 6/2000 |
| JP | 2001-203502 A | | 7/2001 |

OTHER PUBLICATIONS

JP 2001-203502A Machine translation.*
Holden et al., IEEE-GMTT International Microwave Symposium, Digest of Technical Papers (IEEE Cat. No. 72 CHO 612-2-MTT), pp. 47-48 (1972).
Boire et al., IEEE MTT-S International Microwave Symposium Digest, pp. 601-604 (1985).

* cited by examiner

*Primary Examiner*—Stephen E. Jones
(74) *Attorney, Agent, or Firm*—Birch, Stewart, Kolasch & Birch, LLP

(57) ABSTRACT

A phase shift circuit and a phase shifter are achieved which are small in size and wide in bandwidth. The phase shift circuit includes a capacitor, and a series circuit composed of a switching element which exhibits capacitivity when it is in an off-state and an inductor connected in series with this switching element, the series circuit being connected in parallel with the capacitor. The capacitor and one terminal of the series circuit are connected with a high frequency signal input/output terminal, and the other terminal thereof is connected with ground.

6 Claims, 5 Drawing Sheets

F I G. 5
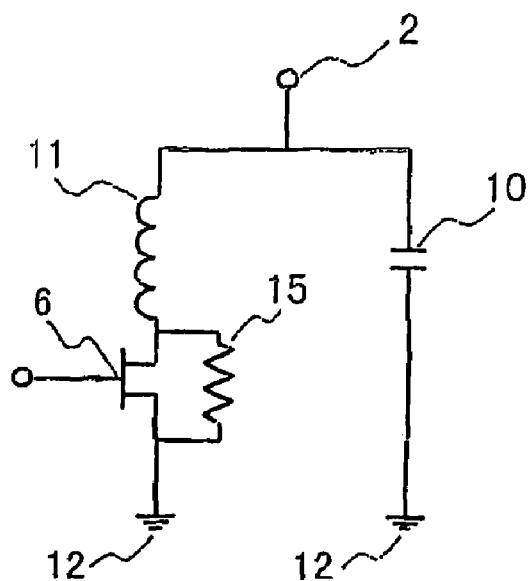
F I G. 6
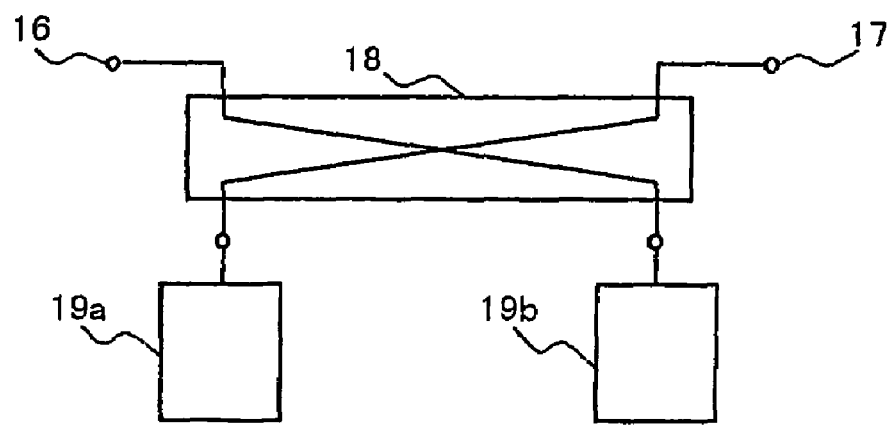

PHASE SHIFT CIRCUIT AND PHASE SHIFTER

This application is the national phase under 35 U.S.C. § 371 of PCT International Application No. PCT/JP03/00042 which has an International filing date of Jan. 7, 2003, which designated the United States of America.

TECHNICAL FIELD

The present invention relates to a phase shift circuit and a phase shifter of a small size and a wide band with a phase shift characteristic.

BACKGROUND ART

FIG. 8 is a view showing a known phase shift circuit (published in Technical Report of IEICE, MW 2001-27, pp. 15–22, June 2001).

In FIG. 8, 2 designates a high frequency signal input/output terminal, 6a a first field-effect transistor (hereinafter referred to as FET), 6b a second FET, 9 a bias terminal for the first FET and the second FET, 10 a capacitor, 11 an inductor, and 12 ground.

The capacitor 10 has one terminal connected with a drain electrode (or source electrode) of the FET 6b, and the other terminal connected with a high frequency signal input/output terminal 2, and the FET 6b also has a source electrode (or drain electrode) grounded. The inductor 11 has one terminal connected with a drain electrode (or source electrode) of the FET 6a, and the other terminal connected with the high frequency signal input/output terminal 2, and the FET 6a also has a source electrode (or drain electrode) grounded. Here, note that a series circuit comprising the FET 6a and the inductor 11 is connected in parallel with a series circuit comprising the FET 6b and the capacitor 10.

In addition, the FET 6a and the FET 6b act as switches for switching between an on-state and an off-state. The bias terminal 9 is connected with gate electrodes of the FET 6a and the FET 6b, respectively, so that the FET 6a and the FET 6b are driven to operate by the same bias voltage.

When a gate voltage of the same potential as those of a drain voltage and a source voltage of the FET 6a is applied to the bias terminal 9, the FET 6a is turned into an on-state, exhibiting resistivity (hereinafter referred to as on-resistance). On the other hand, when a gate voltage equal to or below a pinch-off voltage is applied to the bias terminal 9, the FET 6a is turned into an off-state, exhibiting capacitivity (hereinafter referred to as off-capacitance). The FET 6b operates similarly.

Next, the operation of the known phase shift circuit of the above-mentioned configuration will be explained.

FIG. 9 shows an equivalent circuit diagram when the FET 6a and the FET 6b are both turned into on-states. 13a designates an on-resistance of the FET 6a, and 13b an on-resistance of the FET 6b. Assuming that the on-resistance 13a and the on-resistance 13b are small enough, the circuit shown in FIG. 9 can be considered as a parallel LC circuit comprising the inductor 11 and the capacitor 10. Thus, a signal input from the high frequency signal input/output terminal 2 is reflected due to a phase rotation generated by the above-mentioned parallel LC circuit, so that it is output from the high frequency signal input/output terminal 2.

FIG. 10 shows an equivalent circuit diagram when the FET 6a and the FET 6b are both turned into off states. 14a designates an off-capacitance of the FET 6a, and 14b an off-capacitance of the FET 6b. Assuming that an admittance presented by the series circuit comprising the capacitor 10 and the off-capacitance 14b is small enough, the circuit shown in FIG. 10 can be considered as a series LC circuit comprising the inductor 11 and the off-capacitance 14a. Thus, a signal input from the high frequency signal input/output terminal 2 is reflected due to a phase rotation generated by the above-mentioned series LC circuit, so that it is output from the high frequency signal input/output terminal 2.

The difference between the reflected phase generated by the above-mentioned parallel LC circuit and the reflected phase generated by the above-mentioned series LC circuit is assumed to be a required amount of phase shift. With such an assumption, by switching the on/off states of the FET 6a and the FET 6b, the signal input from the high frequency signal input/output terminal 2 is reflected while obtaining a desired amount of phase shift, and it is then output from the high frequency signal input/output terminal 2.

As described above, the known phase shift circuit is configured such that it requires two switching elements, and hence there has been a problem that the circuit is enlarged in size.

The present invention is intended to solve the problem as referred to above, and has for its object to provide a phase shift circuit and a phase shifter which are small in size and wide in bandwidth.

DISCLOSURE OF THE INVENTION

A phase shift circuit according to the present invention includes a capacitor, and a series circuit composed of a switching element which exhibits capacitivity when it is in an off-state and an inductor connected in series with this switching element, the series circuit being connected in parallel with the capacitor. The capacitor and one terminal of the series circuit are connected with a high frequency signal input/output terminal, and the other terminal thereof is connected with ground.

In addition, the phase shift circuit is characterized in that a resistor is connected in parallel with the switching element.

Moreover, assuming that the capacitance of the capacitor is C, the inductance of the inductor is L, and the capacitance of the switching element in its off-state is $C_1$, the characteristic impedance $Z_0$ of the high frequency signal input/output terminal satisfies an equation $Z_0 = (L/C)^{1/2} = (L/C_1)^{1/2}$.

A phase shifter according to the present invention is resided in that either of the above-mentioned phase shift circuits is connected with a 90° hybrid coupler having a high frequency signal input terminal and a high frequency signal output terminal.

Further, a phase shifter according to the present invention is resided in that the high frequency signal input terminal and the high frequency signal output terminal in the above-mentioned phase shifter are mutually connected with each other in a multistage fashion.

BRIEF DESCRIPTION OF THE DRAWINGS

FIG. 5 is a circuit diagram showing the configuration of a phase shift circuit according to a second embodiment of the present invention;

FIG. 6 is a circuit diagram showing the configuration of a phase shift circuit according to a fourth embodiment of the present invention;

BEST MODE FOR CARRYING OUT THE INVENTION

Embodiment 1.

Figure 1:
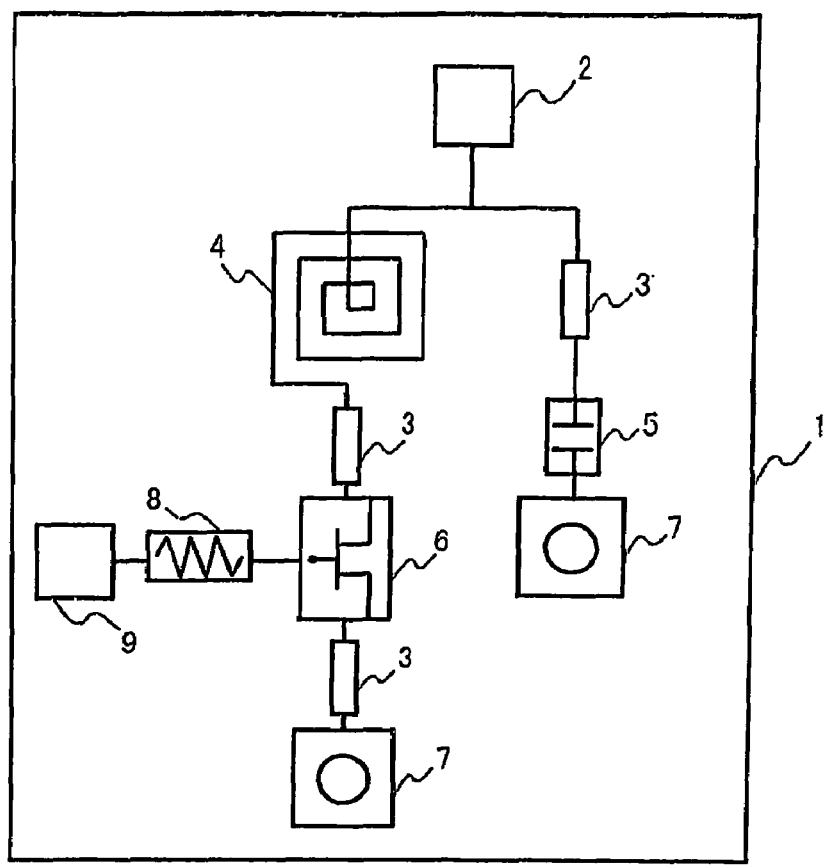
FIG. 1 is a circuit diagram showing the configuration of a phase shift circuit according to a first embodiment of the present invention.

FIG. 1 is a view showing the construction of a phase shift circuit according to a first embodiment of the present invention. 1 designates a semiconductor substrate, 2 a high frequency signal input/output terminal, 3 a line, 4 a spiral inductor, 5 an MIM capacitor, 6 an FET 7 through holes, 8 a resistor, and 9 a bias terminal. The phase shift circuit shown in FIG. 1 is monolithically formed on the semiconductor substrate 1.

Figure 2:
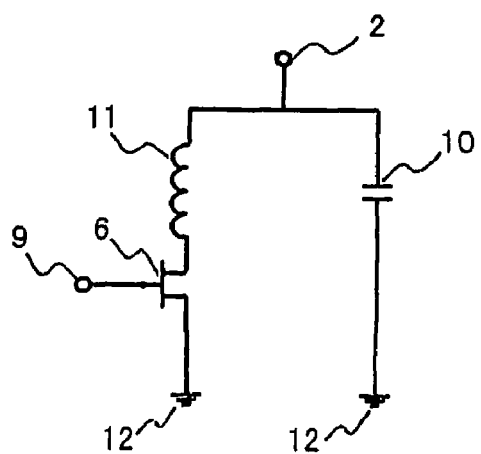
FIG. 2 is an equivalent circuit diagram showing the configuration of the phase shift circuit according to the first embodiment of the present invention.

FIG. 2 is an equivalent circuit diagram of FIG. 1 showing the configuration of the phase shift circuit according to the first embodiment. The same or corresponding parts or components as those of FIG. 1 are identified by the same symbols while omitting overlapping explanations. As new symbols, 10 designates a capacitor corresponding to the MIM capacitor 5, 11 an inductor corresponding to the spiral inductor 4, and 12 ground corresponding to the through holes 7.

The FET 6 acts as switches for switching between an on-state and an off-state. In addition, the bias terminal 9 is connected with a gate electrode of the FET 6.

Here, when a gate voltage of the same potential as those of a drain voltage and a source voltage of the FET 6 is applied to the bias terminal 9, the FET 6 is turned into an on-state, exhibiting resistivity (hereinafter referred to as on-resistance). On the other hand, when a gate voltage equal to or below a pinch-off voltage is applied to the bias terminal 9, the FET 6 is turned into an off-state, exhibiting capacitivity (hereinafter referred to as off-capacitance).

Next, the operation of FIG. 1 is explained by using FIG. 2 that is an equivalent circuit of FIG. 1.

Figure 3:
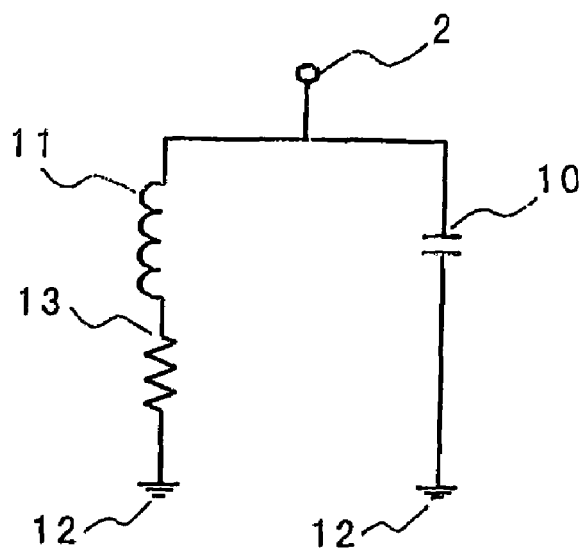
FIG. 3 is an equivalent circuit diagram when an FET 6 of the phase shift circuit according to the first embodiment of the present invention is turned into an on-state.

FIG. 3 shows an equivalent circuit diagram of FIG. 1 when the FET 6 is in an on-state. 13 is an on-resistance of the FET 6. Here, assuming that the on-resistance 13 is small enough, the circuit shown in FIG. 3 can be considered as a parallel LC circuit comprising the capacitor 10 and the inductor 11. Thus, a signal input from the high frequency signal input/output terminal 2 is reflected due to a phase rotation generated by the above-mentioned parallel LC circuit, so that it is output from the high frequency signal input/output terminal 2.

Figure 4:
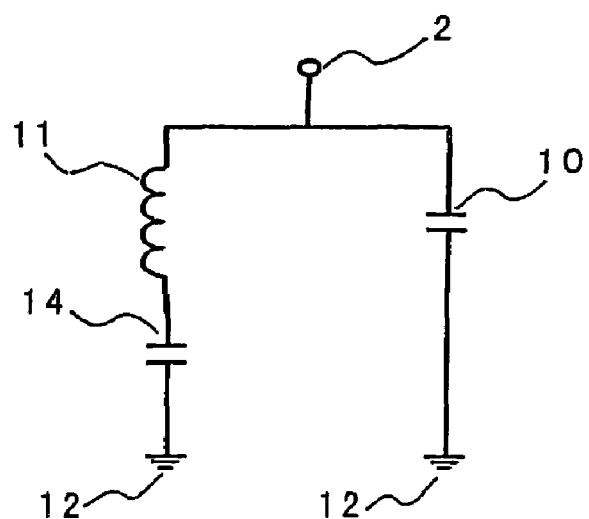
FIG. 4 is an equivalent circuit diagram when the FET 6 in the first embodiment of the present invention is turned into an off state.

FIG. 4 shows an equivalent circuit diagram of FIG. 1 when the FET 6 is in an off-state. 14 is an off-capacitance of the FET 6. Here, assuming that an admittance of the capacitor 10 is small enough, the circuit shown in FIG. 4 can be considered as a series LC circuit comprising the inductor 11 and the off-capacitance 14. Thus, a signal input from the high frequency signal input/output terminal 2 is reflected due to a phase rotation generated by the above-mentioned series LC circuit, so that it is output from the high frequency signal input/output terminal 2.

Therefore, the phase shift circuit of the first embodiment shown in FIG. 1 changes the amount of phase rotation generated upon reflection of the signal input from the high frequency signal input/output terminal 2 by switching between the parallel LC circuit and the series LC circuit through the on/off switching operation of the FET 6.

As described above, according to the phase shift circuit of the first embodiment, a desired amount of phase shift can be obtained due to the difference in the amount of phase rotation by setting the inductance of the inductor 11, the capacitance of the capacitor 10 and the capacitance of the off-capacitance 14 in an appropriate manner. In other words, the circuit can be formed of the single FET, the inductor and the capacitor, so the number of FETs can be decreased by one as compared with the prior art, thus making it possible to reduce the size of the circuit.

Although in the phase shift circuit according to the first embodiment shown in FIG. 1, the FET 6 is used as a switching element, any form of switch can be used as long as it has a switching function capable of switching between an on-state and an off-state. In addition, the phase shift circuit according to the first embodiment shown in FIG. 1 is monolithically formed on the semiconductor substrate 1, but a passive element may be formed on a dielectric substrate and an active element may be formed on a semiconductor substrate, with both of the substrates being electrically connected with each other by means of metal wires, gold bumps, etc., thereby to form a phase shift circuit.

Embodiment 2.

FIG. 5 is a view showing the construction of a phase shift circuit according to a second embodiment of the present invention. As a new symbol, 15 designates a resistor. The same or corresponding parts or components as those of FIGS. 1 and 2 are identified by the same symbols while omitting overlapping explanations. The phase shift circuit according to this second embodiment has, in FIG. 2 showing the configuration of the phase shift circuit according to the above-mentioned first embodiment, the resistor 15 connected in parallel with the FET 6.

Next, the operation of the phase shift circuit of the above-mentioned configuration according to the second embodiment will be explained.

When the FET 6 is in an on-state, the circuit shown in FIG. 5 can be considered as a parallel LC circuit comprising an inductor 11 and a capacitor 10, similar to the above-mentioned first embodiment. Assuming that an admittance of the capacitor 10 is small enough when the FET 6 is in an off-state, the circuit shown in FIG. 5 can be considered as a series LC circuit comprising the inductor 11 and an off-capacitance 14, similar to the above-mentioned first embodiment. In this connection, the difference between an amount of attenuation when the circuit is made to operate as the parallel LC circuit and an amount of attenuation when the circuit is made to operate as the series LC circuit is reduced by means of the resistor 15.

As described above, according to the phase shift circuit of the second embodiment, advantageous effects similar to those of the above-mentioned first embodiment can be obtained. In addition, by appropriately setting the resistor 15, it is possible to reduce the difference between the amount of attenuation when the FET 6 is turned into an on-state to make the circuit operate as a parallel LC circuit and the amount of attenuation when the FET 6 is turned into an off-state to make the circuit operate as a series LC circuit, whereby compensation for the level of a high frequency output signal can be achieved in a simple and easy manner.

Although in the phase shift circuit according to the second embodiment shown in FIG. 5, the FET 6 is used as a switch, any form of switch can be used as long as it has a switching function capable of switching between an on-state and an off state.

In addition, the phase shift circuit according to the second embodiment shown in FIG. 5 is monolithically formed on the semiconductor substrate 1, but a passive element may be formed on a dielectric substrate and an active element may be formed on a semiconductor substrate, with both of the substrates being electrically connected with each other by means of metal wires, gold bumps, etc., thereby to form a phase shift circuit.

Embodiment 3.

In the phase shift circuit according to the first embodiment shown in FIG. 2 and the phase shift circuit according to the second embodiment shown in FIG. 5, assuming that the inductance of the inductor 11 is L, the capacitance of the capacitor 10 is C, the capacitance of the off-capacitance 14 is $C_1$, and the characteristic impedance of the line is $Z_0$, there is formed a phase shift circuit that satisfies the following expression (1).

$$Z_0 = (L/C)^{1/2} = (L/C_1)^{1/2} \quad (1)$$

Next, the operation of the phase shift circuit of the above-mentioned configuration according to a third embodiment will be explained.

Assuming that the reflected phase of the parallel LC circuit is $\phi 1$, and that the reflected phase of the series LC circuit is $\phi 2$, the amount of phase shift $\Phi$ is represented by the difference between the reflected phases of both circuits, that is, $\Phi = \phi 1 - \phi 2$. If the differential coefficient of the amount of phase shift with respect to frequency becomes zero, the amount of phase shift results in a constant value over all frequencies. That is, the following equation has only to be satisfied over all the frequencies: $d\Phi/d\omega = d(\phi 1 - \phi 2)/d\omega = 0$. The solution that satisfies this conditional expression is given by expression (1) above if intermediate expressions are omitted.

When expression (1) above is satisfied, the resonance frequencies of the series LC circuit and the parallel LC circuit become equal to each other, because of $(L/C)^{1/2} = (L/C_1)^{1/2}$. In addition, the series LC circuit is put into a short-circuited state at the resonance frequency, and hence the reflected phase is zero. Also, the parallel LC circuit is put into an open state, so the reflected phase is delayed by 180°.

Therefore, at the resonance frequency, the difference between the reflected phases of both circuits, i.e., the amount of phase shift, becomes 180°. Furthermore, if expression (1) above is satisfied, the amount of phase shift becomes a constant value of 180° over all the frequencies.

As described above, according to the phase shift circuit of the third embodiment, advantageous effects similar to those of the above-mentioned first or second embodiment can be obtained. Besides, by satisfying expression (1) above, the amount of phase shift of 180° can be achieved over a wide frequency range.

Embodiment 4.

FIG. 6 is a view showing the construction of a phase shifter according to a fourth embodiment of the present invention. 16 designates a high frequency signal input terminal, 17 a high frequency signal output terminal, 18 a 90° hybrid coupler, and 19a and 19b reflective terminating circuits. The phase shift circuit according to either of the above-mentioned first through third embodiments is applied to the reflective terminating circuits 19.

Next, the operation of the phase shifter of the above-mentioned configuration according to the fourth embodiment will be explained.

A high frequency signal is input from the high frequency signal input terminal 16 to the 90° hybrid coupler 18. A signal of the same phase as that of the high frequency signal input to the 90° hybrid coupler 18 is input to the reflective terminating circuit 19a, and a signal, which is delayed by 90° in phase, is input to the reflective terminating circuit 19b. The high frequency signals, differing in phase by 90° from each other, are reflected by the reflective terminating circuits 19a, 19b, respectively, while generating desired phase rotations therein.

The reflected high frequency signals are again input to the 90° hybrid coupler 18. Since the phases of the signals reflected by the reflective terminating circuits 19a, 19b are mutually different by 180° from each other at the high frequency signal input terminal 16, no output appears there, and an output is obtained only at the high frequency signal output terminal 17.

Here, note that the phase shift circuit according to either of the above-mentioned first through third embodiments is applied to the reflective terminating circuits 19a, 19b, and by switching the states of the reflective terminating circuits 19a, 19b at the same time, a desired amount of phase shift is obtained from the difference between the reflected phases in the respective states. As a result, the input signal and the output signal are separated from each other, whereby only the signal reflected by the reflective terminating circuits 19 can be taken out as an output signal.

As described above, according to the phase shifter of this fourth embodiment, there can be provided a phase shifter with a one-bit phase shift which generates, as an output signal, only the signal reflected by the reflective terminating circuits 19.

Here, note that the phase shifter according to the fourth embodiment shown in FIG. 6 may be monolithically formed on a semiconductor substrate. In addition, a passive element and a 90° hybrid coupler may be formed on a dielectric substrate and an active element may be formed on a semiconductor substrate, with both of the substrates being electrically connected with each other by means of metal wires, gold bumps, etc., thereby to form a phase shifter.

Embodiment 5.

Figure 7:
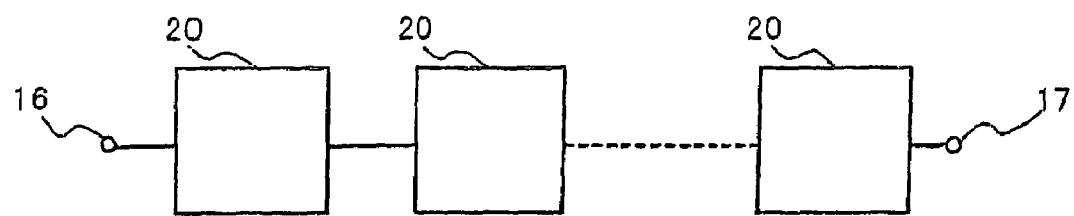
FIG. 7 is a circuit diagram showing the configuration of a phase shifter according to a fifth embodiment of the present invention.
Figure 8:
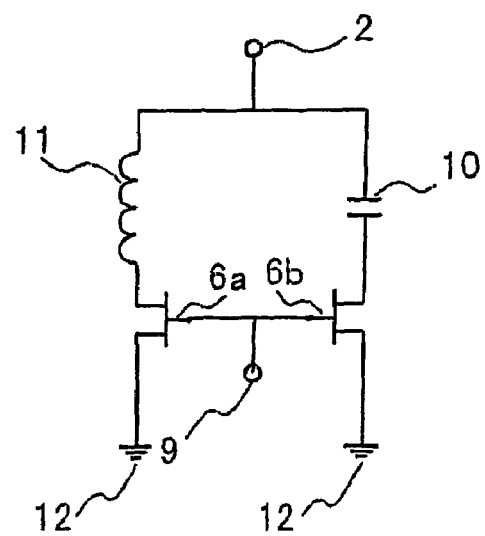
FIG. 8 is a circuit diagram showing the configuration of a known phase shift circuit.
Figure 9:
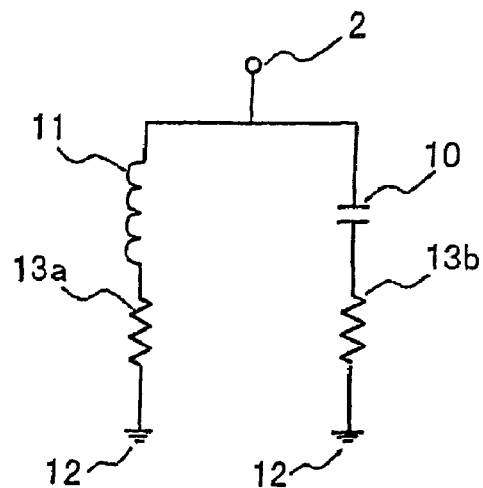
FIG. 9 is an equivalent circuit diagram when an FET 6a and an FET 6b of the known phase shift circuit are made into on-states.
Figure 10:
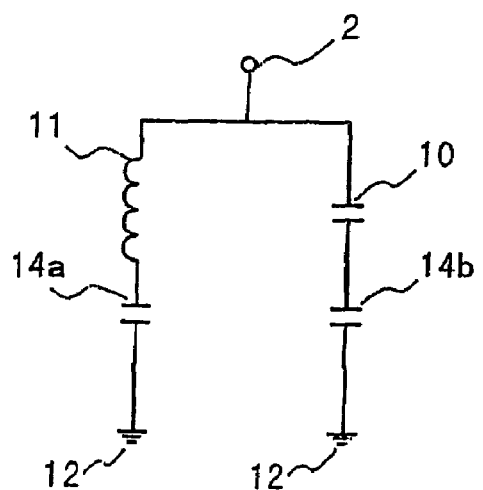
FIG. 10 is an equivalent circuit diagram when the FET 6a and the FET 6b of the known phase shift circuit are made into off-states.

FIG. 7 is a view showing the construction of a phase shifter according to a fifth embodiment of the present invention. 20 designates a phase shifter of a one-bit phase shift, and a plurality of phase shifters 20 are connected with one another in a multistage fashion. The same or corresponding parts or components as those of FIG. 6 are identified by the same symbols while omitting overlapping explanations. Here, the phase shifter described in the above-mentioned fourth embodiment is applied to the phase shifters 20. A phase shifter unit that operates in multi-bit can be achieved by connecting the one-bit phase shifters 20 with one another in a multistage fashion.

Here, note that the phase shifter according to the fifth embodiment shown in FIG. 5 may be monolithically formed on a semiconductor substrate. Moreover, a passive element and a 90° hybrid coupler may be formed on a dielectric substrate and an active element may be formed on a semiconductor substrate, with both substrates being electrically connected with each other through metal wires, gold bumps, etc., thereby to form a phase shifter.

According to a phase shift circuit of the present invention, the phase shift circuit includes a capacitor, and a series circuit composed of a switching element which exhibits capacitivity when it is in an off-state and an inductor connected in series with this switching element, the series circuit being connected in parallel with the capacitor. The capacitor and one terminal of the series circuit are connected with a high frequency signal input/output terminal, and the other terminal thereof is connected with ground. Thus, by setting the inductance of the inductor, the capacitance of the capacitor and the capacitance of the off-capacitance in an appropriate manner, it is possible to obtain a desired amount of phase shift due to the difference in the amount of phase rotation. That is, the phase shift circuit can be formed by using the single switching element, and hence reduction in size of the circuit can be achieved.

In addition, a resistor is connected in parallel with the switching element, so that by appropriately setting the resistor, it is possible to reduce the difference between an amount of attenuation when the switching element is turned into an on-state to make the circuit operate as a parallel LC circuit and an amount of attenuation when the switching element is turned into an off-state to make the circuit operate as a series LC circuit, as a consequence of which compensation for the level of a high frequency output signal can be achieved in a simple and easy manner.

Moreover, assuming that the capacitance of the capacitor is C, the inductance of the inductor is L, and the capacitance of the switching element in its off-state is $C_1$, the characteristic impedance $Z_0$ of the high frequency signal input/output terminal satisfies an equation $Z_0=(L/C)^{1/2}=(L/C_1)^{1/2}$. As a result, the amount of phase shift can be made to be 180° over a wide frequency range.

Further, either of the above-mentioned phase shift circuits is connected with a 90° hybrid coupler having a high frequency signal input terminal and a high frequency signal output terminal, so that a desired amount of phase shift can be obtained according to the difference in the reflected phases of the respective phase shift circuits. Accordingly, it is possible achieve a phase shifter with a one-bit phase shift which is capable of taking out only the signal reflected by the phase shift circuits as an output signal by separating a high frequency input signal and a high frequency output signal from each other.

Furthermore, by mutually connecting the above-mentioned high frequency signal input terminal and the above-mentioned high frequency signal output terminal in the above-mentioned phase shifter with each other in a multistage fashion, it is possible to achieve a phase shifter that operates in multi-bit.

INDUSTRIAL APPLICABILITY

As described above, according to the present invention, it is possible to achieve a phase shift circuit and a phase shifter which are small in size and wide in bandwidth.

The invention claimed is:

1. A phase shift circuit comprising:
   a capacitor; and
   a series circuit composed of a transistor and an inductor connected in series with the transistor, said series circuit being connected in parallel with said capacitor;
   wherein a gate of the transistor is connected with a bias terminal so that when a source voltage is applied to the bias terminal the transistor exhibits a resistivity and so that when the source voltage is equal to or below a pinch-off voltage the transistor exhibits a capacitivity,
   wherein said capacitor and one terminal of said series circuit are electrically connected with a high frequency signal input/output terminal,
   wherein the capacitor is directly connected with ground, and
   wherein the capacitance of said capacitor is C, the inductance of said inductor is L, the capacitance of said transistor is $C_1$ when exhibiting capacitivity, and the characteristic impedance $Z_0$ of said high frequency signal input/output terminal satisfies an equation $Z_0=(L/C)^{1/2}=(L/C_1)^{1/2}$.

2. The phase shift circuit according to claim 1, wherein a resistor is connected in parallel with said transistor.

3. The phase shift circuit according to claim 1, wherein the series circuit is directly connected to ground.

4. The phase shift circuit according to claim 1, wherein the transistor is a field effect transistor.

5. The phase shifter according to claim 1, wherein said phase shift circuit is connected with a 90° hybrid coupler having a high frequency signal input terminal and a high frequency signal output terminal.

6. The phase shifter according to claim 5, wherein said high frequency signal input terminal and said high frequency signal output terminal in said phase shifter are mutually connected with each other in a multistage fashion.

* * * * *